United States Patent
Kim et al.

(10) Patent No.: US 6,508,878 B2
(45) Date of Patent: Jan. 21, 2003

(54) GAN SYSTEM COMPOUND SEMICONDUCTOR AND METHOD FOR GROWING CRYSTAL THEREOF

(75) Inventors: Chin Kyo Kim, Seoul (KR); Tae Kyung Yoo, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/794,615

(22) Filed: Feb. 28, 2001

(65) Prior Publication Data

US 2001/0009134 A1 Jul. 26, 2001

Related U.S. Application Data

(62) Division of application No. 09/416,269, filed on Oct. 12, 1999.

(30) Foreign Application Priority Data

Oct. 15, 1998 (KR) .............................. 98-43212

(51) Int. Cl.[7] .............................. C30B 25/16
(52) U.S. Cl. ........................................... 117/89
(58) Field of Search ........................ 117/88, 89, 952

(56) References Cited

U.S. PATENT DOCUMENTS

| | | | | |
|---|---|---|---|---|
| 5,122,845 A | * | 6/1992 | Manabe et al. | 357/17 |
| 5,218,216 A | * | 6/1993 | Manabe et al. | 257/103 |
| 5,281,830 A | * | 1/1994 | Kotaki et al. | 257/86 |
| 5,290,393 A | * | 3/1994 | Nakamura | 156/613 |
| 5,393,993 A | * | 2/1995 | Edmond et al. | 257/77 |
| 5,523,589 A | * | 6/1996 | Edmond et al. | 257/77 |
| 5,656,832 A | * | 8/1997 | Ohba et al. | 257/190 |
| 5,679,152 A | | 10/1997 | Tischler et al. | 117/97 |
| 5,798,537 A | * | 8/1998 | Nitta | 257/103 |
| 6,156,581 A | * | 12/2000 | Vaudo et al. | 438/22 |

FOREIGN PATENT DOCUMENTS

GB 2344461 A * 7/2000 ............. H01L/33/00

OTHER PUBLICATIONS

Matsuoka et al., "Growth and Properties of a Wide–Gap Semiconductor InGaN," Optoelectronics–Devices and Technologies, vol. 5(1), pp. 53–64, Jun. 1990.*

Jenkins et al., "Electronic Structures and Doping of InN, InxGa1–xN, and InxAl1–xN," Physical Review B, vol. 39(5), pp. 3317–3329, Feb. 1989.*

* cited by examiner

Primary Examiner—Robert Kunemund
Assistant Examiner—Matthew Anderson
(74) Attorney, Agent, or Firm—Fleshner & Kim, LLP

(57) ABSTRACT

GaN system compound semiconductor and method for growing a crystal thereof, which can significantly reduce a concentration of crystalline defects caused by lattice mismatch by growing a GaN system compound semiconductor of GaN or $In_xGa_{1-x}N$ by using $In_xAl_{1-x}N$ crystal on a substrate as an intermediate buffer layer, the method including the steps of (1) providing a sapphire substrate, (2) growing an intermediate buffer layer of $In_xAl_{1-x}N$ on the sapphire substrate, and (3) growing GaN or $In_xGa_{1-x}N$ system compound semiconductor on the intermediate buffer layer.

5 Claims, 1 Drawing Sheet

GAN SYSTEM COMPOUND SEMICONDUCTOR AND METHOD FOR GROWING CRYSTAL THEREOF

This application is a Divisional of Application No. 09/416,269 filed Oct. 12, 1999.

BACKGROUND OF THE INVENTION

1. Field of the Invention

The present invention relates to a GaN system compound semiconductor used in a blue laser diode or a blue light emissive diode and a method for fabricating the same, and more particularly, to a GaN system compound semiconductor in which an $In_xAl_{1-x}N$ crystal is grown initially on a sapphire substrate as a buffer layer, and a GaN or an $In_xGa_{1-x}N$ crystal, GaN system semiconductor, is grown thereon, for improving a surface flatness of the crystal, reducing a stress, and crystal defects; and a method for growing a crystal thereof.

2. Background of the Related Art

GaN or $In_xGa_{1-x}N$ crystal, GaN system semiconductor widely used in blue laser diodes or blue light emissive diodes, is fabricated by MOVPE(Metal Organic Vapor Phase Epitaxy) in which an AlN or GaN crystal is grown to a thickness of a few tens of nm at a low temperature of 500 - 600° C. on a sapphire($Al_2O_3$) substrate and growing a GaN or $In_xGa_{1-x}N$ crystal at an elevated temperature in the vicinity of 1100° C. When the AlN or GaN intermediate buffer layer is grown on the sapphire substrate at a low temperature, a rugged columnar AlN or GaN crystal is grown at first, and when a crystal is grown using the irregular columnar AlN or GaN crystal as basis at an elevated temperature, the crystal is grown evenly in a lateral direction, facilitating comparatively flat single crystal growth when the crystal is grown to a certain thickness. The GaN or $In_xGa_{1-x}N$ crystal growth on the AlN or GaN intermediate buffer layer grown at a low temperature has advantages in that drawbacks caused by crystal lattice mismatch between the sapphire substrate and the GaN or $In_xGa_{1-x}N$ crystal and a difference of expansion coefficients can be improved.

However, the AlN or GaN intermediate buffer layer grown on the sapphire substrate at a low temperature controls a crystal characteristics at a starting of crystallization, which in turn controls the GaN or $In_xGa_{1-x}N$ crystal characteristics, which is grown thereafter. Because crystal defects of the GaN or $In_xGa_{1-x}N$ grown on AlN or GaN are dependent on the initial crystal of the AlN or GaN grown on the sapphire substrate, particularly the large space between columnar crystals formed initially and the great crystallization stress coming from the comparatively strong crystal bonding force of the AlN or GaN controls an irregularity (i.e., spaces between respective microcrystals), crystalline, and a surface size of the column, of the initial columns of the AlN or GaN, the GaN or $In_xGa_{1-x}N$ crystal defects has a high crystal defect concentration in a range of approx. $10^9/cm^2$, if the GaN or $In_xGa_{1-x}N$ crystal is grown by using the AlN or GaN crystal on the sapphire substrate as an intermediate buffer layer.

SUMMARY OF THE INVENTION

Accordingly, the present invention is directed to a GaN system compound semiconductor and a method for growing a crystal thereof that substantially obviates one or more of the problems due to limitations and disadvantages of the related art.

An object of the present invention is to provide a GaN system compound semiconductor and a method for growing a crystal thereof, which can reduce a concentration of crystalline defects caused by lattice mismatch, significantly.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for growing a crystal of a GaN system compound semiconductor, including the steps of (1) providing a sapphire substrate, (2) crowing an intermediate buffer layer of $In_xAl_{1-x}N$ on the sapphire substrate, and (3) growing GaN or $In_xGa_{1-x}N$ system compound semiconductor on the intermediate buffer layer.

In other aspect of the present invention, there is provided a method for growing a crystal of a GaN system compound semiconductor, including the steps of (1) providing a sapphire substrate, (2) growing a superlattice structure of $In_xAl_{1-x}xN/AlN$ or $In_xAl_{1-x}N/GaN$ on the sapphire substrate as an intermediate buffer layer, and (3) growing a GaN system compound semiconductor of GaN or $In_xGa_{1-x}N$ on the intermediate buffer layer.

In another aspect of the present invention, there is provided a GaN system compound semiconductor including a sapphire substrate, an intermediate buffer layer of $In_xAl_{1-x}N$ grown on the sapphire substrate, and a GaN system compound semiconductor of GaN or $In_xGa_{1-x}N$ grown on the intermediate buffer layer.

In further aspect of the present invention, there is provided a GaN system compound semiconductor including a sapphire substrate, a superlattice structure of $In_xAl_{1-x}/AlN$ or $In_xAl_{1-x}N/GaN$ grown on the sapphire substrate as an intermediate buffer layer, and a GaN system compound semiconductor of GaN or $In_xGa_{1-x}N$ grown on the intermediate buffer layer.

By using $In_xAl_{1-x}N$ or $In_xAl_{1-x}N/GaN$ as an intermediate buffer layer, which has a lattice constant in the middle of a lattice constant of the GaN system compound semiconductor of GaN or $In_xGa_{1-x}N$ intended to grow on a sapphire substrate, the GaN system compound semiconductor and the method for growing a crystal thereof of the present invention can overcome a great lattice mismatch between the substrate and the GaN system compound semiconductor which can not be sustained only by AlN, to reduce a concentration of crystalline defects caused by the lattice mismatch, significantly.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
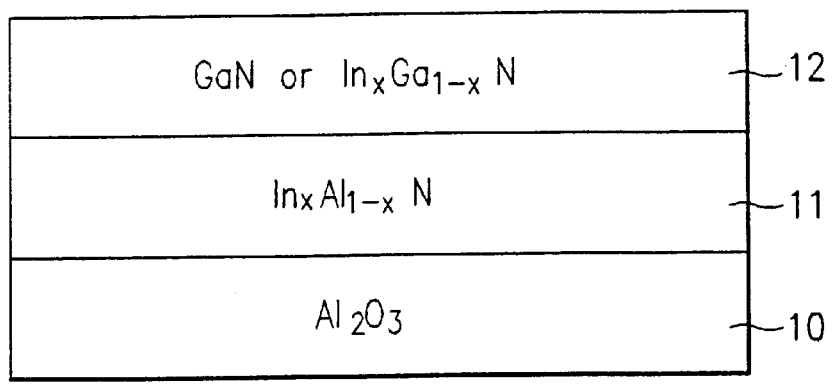
FIG. 1 illustrates a section of a GaN system compound semiconductor grown in accordance with a first preferred embodiment of the present invention, schematically; and, FIG. 2 illustrates a section of a GaN system compound semiconductor grown in accordance with a second preferred embodiment of the present invention, schematically.

Reference will now be made in detail to the preferred embodiments of the present invention, examples of which are illustrated in the accompanying drawings. FIG. 1 illustrates a section of a GaN system compound semiconductor grown in accordance with a first preferred embodiment of the present invention.

Referring to FIG. 1, the method for growing a GaN system compound semiconductor in accordance with a preferred embodiment of the present invention starts with providing a sapphire $Al_2O_3$ substrate 10 and growing an $In_xAl_{1-x}N$ intermediate buffer layer 11. In the formation of the buffer layer 11, TMAl(Tri-Methyl-Aluminum) or TEAl (Tri-Eethyl-Aluminum) is used as a source of aluminum in the $In_xAl_{1-x}N$, TMIn(Tri-Methyl-Indium) or TEIn(Tri-Ethyl-Indium) is used as a source of In in the $In_xAl_{1-x}N$, $NH_3$ or $N_2$ gas as a source of N, and $H_2$ or $N_2$ is used as a carrier gas for carrying the sources of Al and In. A crystal growth temperature may be optimized according to an In composition 'x' in the $In_xAl_{1-x}N$ in a range of 200 - 1,100° C. depending on a crystal growing equipment for carrying out an MOVPE, and the $In_xAl_{1-x}N$ has a thickness of 10-10,000 Å. If the $In_xAl_{1-x}N$ has a thickness greater than 10,000 Å, the $In_xAl_{1-x}N$ may have additional crystalline defects caused by its own strain energy, and if the $In_xAl_{1-x}N$ has a thickness smaller than 10 Å, the $In_xAl_{1-x}N$ can not function as a buffer layer as the $In_xAl_{1-x}N$ is too thin. An In composition 'x' in $In_xAl_{1-x}N$ is 0<x<1, wherein the lattice mismatch between the substrate and the GaN or $In_xGa_{1-x}N$ can be minimized if 'x' is approx. 0.05 when a GaN is grown by using $In_xAl_{1-x}N$ as an intermediate buffer layer, and if 'x' is approx. 0.1 when the $In_xGa_{1-x}N$ is grown. The intermediate buffer layer 11 may be doped with N type or P type as necessary. Then, a temperature of the substrate is elevated and GaN or $In_xGa_{1-x}N$ are grown on the intermediate buffer layer 11 as a GaN system compound semiconductor layer. In the case of growing GaN, the GaN is grown at a temperature of 900 - 1,100° C., and in the case of growing $In_xGa_{1-x}N$, the $In_xGa_{1-x}N$ is grown at a temperature of 550 - 800° C. In a case when the In composition in $In_xAl_{1-x}N$, the buffer layer 11, starts to increase, the crystal growing temperature is elevated for growing the $In_xGa_{1-x}N$ or GaN, a GaN system compound semiconductor, after the $In_xAl_{1-x}N$ intermediate buffer layer 11 is grown, when a problem of In vaporization at a surface of the $In_xAl_{1-x}N$ may be caused. In order to prevent this, it is preferable that a protection film(not shown) of a thin GaN with a thickness of 5 - 50 Å is grown on the $In_xAl_{1-x}N$ intermediate buffer layer 11.

Figure 2:
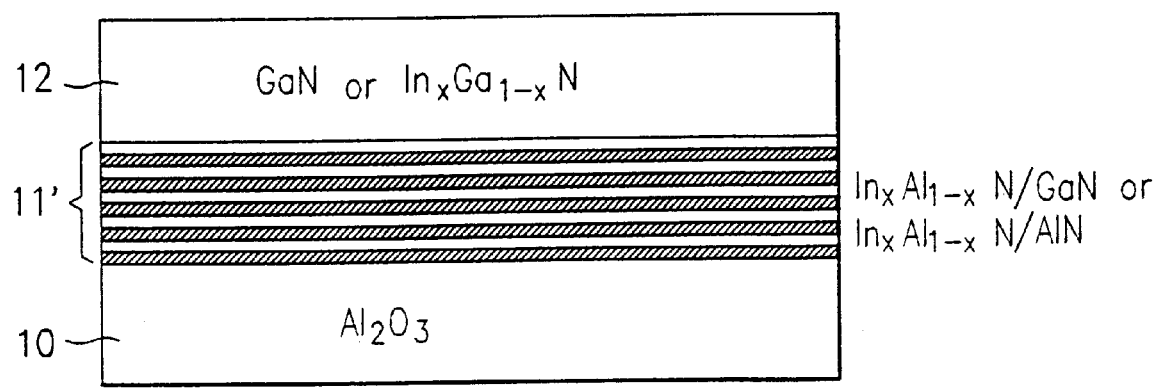

FIG. 2 illustrates a section of a GaN system compound semiconductor grown in accordance with a second preferred embodiment of the present invention, schematically. Though the first embodiment suggests to use the $In_xAl_{1-x}N$ as the intermediate buffer layer, the second embodiment suggests to use an $In_xAl_{1-x}N$ /GaN or $In_xAl_{1-x}N$/AlN superlattice layer as the intermediate buffer layer 11', otherwise both embodiment are the same. Therefore, components identical to the first embodiment are given the same reference symbols, and explanations on the components will be omitted. It is discussed in the first embodiment that, if the $In_xAl_{1-x}N$ is too thick to be greater than 10,000 Å, the $In_xAl_{1-x}N$ may have additional crystalline defects caused by its own strain energy. Accordingly, in order to improve the drawback of the first embodiment, $In_xAl_{1-x}N/GaN$ or $In_xAl_{1-x}N/AlN$ superlattice layer is grown as the intermediate buffer layer 11' in the second embodiment instead of the $In_xAl_{1-x}N$ as the intermediate buffer layer. Of the superlattice of $In_xAl_{1-x}N/GaN$ or $In_xAl_{1-x}N/AlN$ in the intermediate buffer layer 11, the $In_xAl_{1-x}N/GaN$ is formed to have a thickness of 1 - 200 Å, and the GaN or the AlN is formed to have a thickness of 1 - 200 Å, with 1 - 300 layers.

As has been explained, the GaN system compound semiconductor and the method for growing a crystal thereof has the following advantages.

First, as an amount of In in the $In_xAl_{1-x}N$ is varied, a lattice constant C of the $In_xAl_{1-x}N$ is expressed as C=3.112+ 0.436x, the lattice mismatch between the substrate and the GaN or $In_xGa_{1-x}N$ can be minimized if 'x' is approx. 0.05 when a GaN is grown by using $In_xAl_{1-x}N$ as an intermediate buffer layer, and if 'x' is approx. 0.1 when the $In_xGa_{1-x}N$ is grown, by using such an $In_xAl_{1-x}N$ as the intermediate buffer layer, crystalline defects caused by lattice mismatch can be reduced, significantly.

Second, by adding In to AlN to produce $In_xAl_{1-x}N$ alloy which has a better ductility than AlN that can improve a capability to absorb a strain energy coming from the lattice mismatch, a concentration of crystalline defects of GaN or $In_xGa_{1-x}N$ layer grown on the buffer layer can be reduced, substantially.

It will be apparent to those skilled in the art that various modifications and variations can be made in the GaN system compound semiconductor and the method for growing a crystal thereof of the present invention without departing from the spirit or scope of the invention. Thus, it is intended that the present invention cover the modifications and variations of this invention provided they come within the scope of the appended claims and their equivalents.

What is claimed is:

1. A method for growing, a crystal of a GaN system compound semiconductor, comprising the steps of:
   (1) providing a sapphire substrate;
   (2) growing a superlattice structure of $In_xAl_{1-x}N/AlN$ or $In_xAl_{1-x}N/GaN$ on the sapphire substrate as an intermediate buffer layer; and,
   (3) growing a GaN system compound semiconductor of GaN or $In_xGa_{1-x}N$ on the intermediate buffer layer.

2. A method as claimed in claim 1, wherein the intermediate buffer layer has a thickness of 10~10,000 Å.

3. A method as claimed in claim 1, further comprising the step of forming a protection layer of GaN on the intermediate buffer layer for preventing vaporization of In contained in the intermediate buffer layer before elevating a temperature after the step (2).

4. A method as claimed in claim 1, wherein the superlattice structure has 1~300 layered wherein an $In_xAl_{1-x}N$ layer in the superlattice structure has a thickness of 1~200 Å and the GaN or AlN layer has a thickness of 1~200 Å.

5. A method as claimed in claim 1, further comprising a protection layer of GaN grown on the intermediate buffer layer for preventing vaporization of In contained in the intermediate buffer layer before elevating a temperature after the intermediate buffer layer is formed.

* * * * *